United States Patent [19]

Burrus, Jr. et al.

[11] 4,301,463
[45] Nov. 17, 1981

[54] DEMULTIPLEXING PHOTODETECTOR

[75] Inventors: Charles A. Burrus, Jr., Fair Haven; Joe C. Campbell, Middletown; Andrew G. Dentai, Highlands; Tien P. Lee, Holmdel, all of N.J.

[73] Assignee: Bell Telephone Laboratories, Incorporated, Murray Hill, N.J.

[21] Appl. No.: 128,305

[22] Filed: Mar. 7, 1980

[51] Int. Cl.³ ............................................ H01L 27/14
[52] U.S. Cl. ...................................... 357/30; 357/16; 357/61
[58] Field of Search .............................. 357/30, 16, 61

[56] References Cited

U.S. PATENT DOCUMENTS

| 3,537,029 | 10/1970 | Kressel | 331/94.5 |
|---|---|---|---|
| 3,821,777 | 6/1974 | James | 357/39 |
| 4,213,138 | 7/1980 | Campbell | 357/30 |
| 4,285,375 | 3/1981 | Hsieh | 357/16 |

OTHER PUBLICATIONS

Sakai, Appl. Phys. Lett., vol. 35, No. 8, Oct. 15, 1979, pp. 588–589.

Campbell, Appl. Phys. Lett., vol. 34, No. 6, Mar. 15, 1979, pp. 401–402.
Illegem, Appl. Phys. Lett., vol. 33, No. 7, Oct. 1, 1978, pp. 629–631.

Primary Examiner—Martin H. Edlow
Attorney, Agent, or Firm—Daniel D. Dubosky

[57] ABSTRACT

A three terminal, totally integrated demultiplexing photodiode is disclosed wherein information present simultaneously at two wavelengths can be developed into two separate currents available at the three terminals. Two quaternary layers (203 and 205) of indium, gallium, arsenide phosphide having unequal bandgaps and each having a pn junction are separated by a buffer layer (204) of n type indium phosphide. Operation at longer wavelengths is achieved by causing the bottom quaternary layer to have the higher bandgap energy thereby permitting it to detect the shorter wavelengths in the radiation and causing the topmost quaternary layer (205) to have the lower bandgap energy thereby permitting it to detect the longer wavelengths. The bottom contact (213) on the substrate has an opening thereby providing a window (230) through which incoming radiation (250) can be coupled through the substrate to the two quaternary layers.

3 Claims, 3 Drawing Figures

DEMULTIPLEXING PHOTODETECTOR

BACKGROUND OF THE INVENTION

Wavelength division multiplexing is a technique that may be used to improve the efficiency and increase the utility of lightwave systems by expanding the information transmission rate without increasing the bit rate. Wavelength division multiplexing could lead to lower system costs through simplified circuitry and a reduction in the number of required repeaters, and could increase the possibility of adding system capabilities such as two-way transmission or simultaneous transmission of analog and digital signals.

Several passive devices for wavelength division multiplexing the demultiplexing have been reported in the prior art. In addition, a new photodetector demultiplexing structure that uses stacked epitaxial indium, gallium, arsenide phosphide layers to detect and demultiplex two wavelength bands has been disclosed in a recent copending application. See application Ser. No. 969,346 entitled "Demultiplexing Photodetector", filed on Dec. 14, 1978, by J. C. Campbell and T. P. Lee. The device disclosed in the copending application has also been reported in the article entitled "Dual-Wavelength Demultiplexing InGaAsP Photodiode" by J. C. Campbell et al, *Applied Physics Letters*, 34(6), Mar. 15, 1979, pp. 401–402.

The demultiplexing photodetector disclosed in the above-identified copending application and article by J. C. Campbell et al is also shown as FIG. 1 in the drawings of this application. As indicated in FIG. 1, the prior art device consists of five epitaxial layers grown on a <111> indium phosphide substrate. Two of these layers 103 and 105 denoted as $Q_1$ and $Q_2$ respectively in FIG. 1 are InGaAsP layers that have different crystal compositions and therefore different bandgap energies. These layers are positioned such that the incoming light 150 first strikes quaternary layer 105 ($Q_2$) having the larger bandgap energy. Photons in the incoming light having an energy less than the bandgap of the indium phosphide window layer 106 but greater than that of the $Q_2$ layer 105 are absorbed in that layer. The photogenerated carriers are collected by the pn junction 109 in $Q_2$ and appear as a signal $V_2$ across the load impedance 115. Similarly, the $Q_1$ layer 103 absorbs photons whose energy is less than the bandgap of $Q_2$ layer 105 but greater than that of $Q_1$ layer 103 thereby giving rise to a signal $V_1$ across the load impedance 116. In this prior art device, indium phosphide layer 106 is also necessary in order to prevent a recombination of holes and electrons that would otherwise take place at the surface of the quaternary layer 105.

Experiments with the prior art device shown in FIG. 1 have revealed that the operation of the device is limited to wavelengths that are less than or equal to about 1.25 micrometers. Attempts to make a device that worked at longer wavelengths were unsuccessful.

SUMMARY OF THE INVENTION

The present invention is based on the discovery that our difficulty in fabricating demultiplexing photodiodes having longer wavelengths and using the prior art structure was that the lower bandgap quaternary layer designated as 103 in FIG. 1 tended to be dissolved or melted during the subsequent fabrication of the higher bandgap layers. As shown in FIG. 1, the growth of the $Q_1$ layer 103 is followed by the growth of an indium phosphide layer 104. The indium phosphide melt from which this layer is grown is saturated with respect to phosphorous but undersaturated with respect to arsenic and gallium, and, therefore, during the growth of indium phosphide layer 104 the melt tends to dissolve the quaternary layer 103. This tendency becomes worse for decreasing phosphorous concentrations in the quaternary layer and, therefore, worse for quaternary layers that have smaller bandgap energies. This "melt back" is particularly severe for compositions corresponding to wavelengths longer than about 1.3 micrometers.

In accordance with the present invention the difficulty of growing longer wavelength demultiplexing photodetectors is eliminated by fabricating a device wherein the first quaternary layer to be deposited has the larger bandgap energy and the second quaternary layer to be deposited has the smaller bandgap energy. A window is opened in the electrical contact deposited on the bottom of the substrate in order to permit the incoming radiation to be coupled through the substrate and first impinge on the quaternary layer having the higher bandgap energy. This presents no problem in the InGaAsP system since the indium phosphide substrate is transparent to both of the wavelengths to be absorbed in the two quaternary layers. Inasmuch as the radiation is presented to the second quaternary layer through its bottom surface, that is, through the surface of this layer that is closest to the substrate, the top indium phosphide layer 106 that was required in the prior art device is no longer necessary. As a result of this new and improved structure, the operating wavelengths have been extended to wavelengths that are longer than 1.3 micrometers and a device has been produced that is improved in almost all of its electrical characteristics.

BRIEF DESCRIPTION OF THE DRAWINGS

The above-stated advantages will be more readily apparent after reading the following detailed description when taken in conjunction with the drawings wherein.

DETAILED DESCRIPTION

Figure 1:
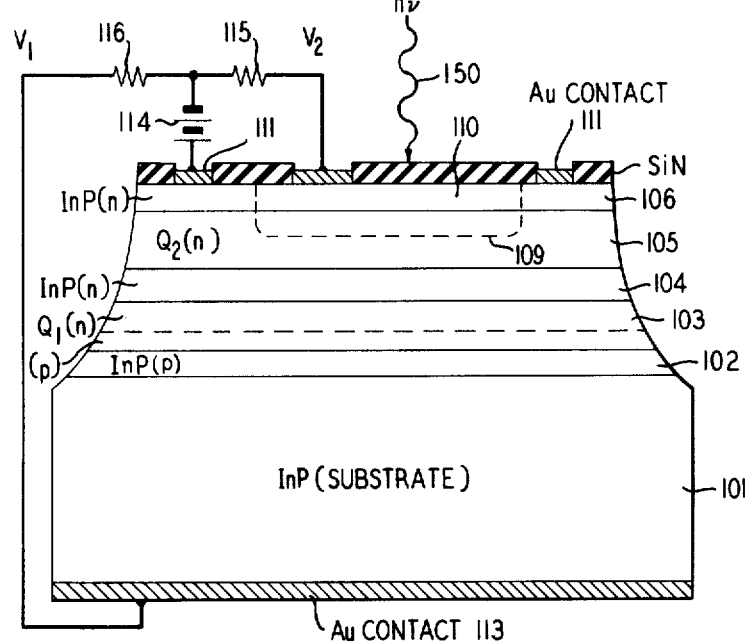
FIG. 1 is a schematic diagram of a prior art dual wavelength demultiplexing photodetector.
Figure 2:
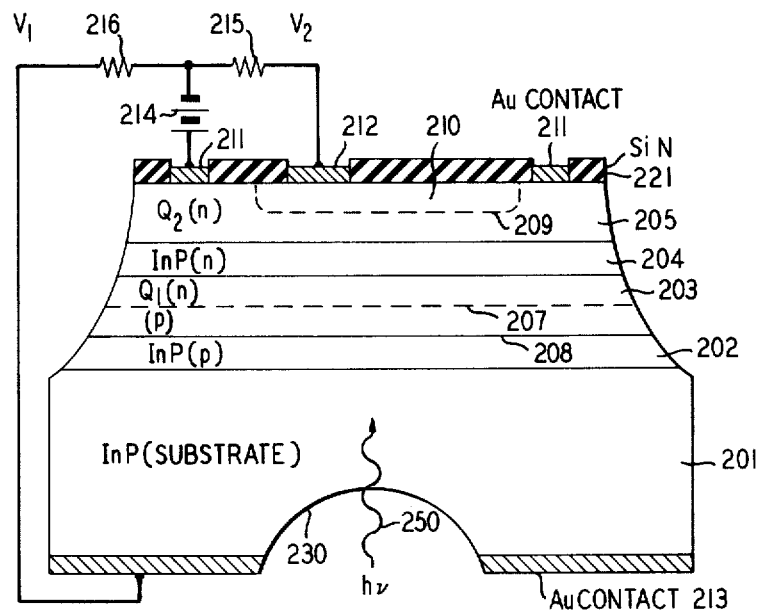
FIG. 2 is a schematic diagram of a demultiplexing photodetector constructed in accordance with the present invention.

The dual wavelength photodetector shown in FIG. 2 is constructed on a <111> oriented indium phosphide substrate 201 by liquid phase epitaxy using a quasi equilibrium solution technique. For further explanation of this technique see the article entitled "Smaller Area High Radiance CW InGaAsP L. E. D.s emitting at 1.2 to 1.3 μm" by A. G. Dentai, T. P. Lee and C. A. Burrus, *Electronics Letter*, Vol. 13, 1977, pp. 484–485. The first layer grown is a zinc doped layer 202 of p-type indium phosphide. This is followed in succession by a $In_{0.70}Ga_{0.30}As_{0.66}P_{0.34}$ layer 203 ($Q_1$), a layer 204 of indium phosphide and a top layer 205 ($Q_2$) of $In_{0.53}Ga_{0.47}As$. Use of this top ternary layer permits extension of the long wavelength response to about 1.6 micrometers. As in the prior art structure of FIG. 1, the quaternary layers are 3 μm to 5 μm thick and are undoped n-type. The background doping level in the $Q_1$ and $Q_2$ layers has been reduced, however, from about $2\times10^{17}$ cm$^{-3}$ to about $1\times10^{16}$ cm$^{-3}$ by prebaking the indium at 700° C. for 16 hours.

The ternary layer 205 may, of course, be another quaternary with some phosphorous content if the device to be fabricated does not have to operate in the long wavelength regions provided by the use of a ternary layer. For this reason the term quaternary in this patent is intended to cover the full range of element values available as ternaries and quaternaries in the InGaAsP materials system.

After crystal growth the wafer is annealed in a vacuum at 650° C. for one hour to drive the zinc from the zinc doped indium phosphide layer 202 into $Q_1$ layer 203 thereby forming a pn junction 207 approximately 1 micrometer from the $Q_1$-InP interface 208. During this drive in diffusion the entire surface is protected by a silicon nitride (SiN) film to prevent surface decomposition. A second pn junction 209 about 3 micrometers deep into the $Q_2$ layer 205 is then formed by diffusing zinc for 35 minutes at 550° C. into a 150 micrometer diameter window region 210 that has been opened in the silicon nitride masking film. As a result of this latter diffusion the p-type region 210 which creates the junction in $Q_2$ is restricted to only a portion of the top surface thereby permitting electrical contact to be established with the n side of the pn junctions 207 and 209 by way of a contact ring 211 on the top surface of the $Q_2$ layer 205.

As indicated in FIG. 2 the present device, like the prior art device, is a three terminal device. Two of the terminals, the one making contact to the common n region of junctions 207 and 209 and the other one making contact to the p region 210 are fabricated by pulse electroplating gold simultaneously onto the p region 210 and the n region of the topmost layer 205. Prior to plating these contacts the entire top surface of the crystal is covered with a layer of silicon nitride. The areas of this layer corresponding to the contact to be established are then opened by masking with a photoresist and plasma etching the layer of silicon nitride. The areas of the silicon nitride layer that are not etched remain on the top surface so as to provide electrical isolation between the electrical contacts. The contact to the n region designated as 211 in FIG. 1 can be shaped like a horseshoe as in the prior art device. The contact to the p region 210 is a 50 micrometer dot designated as 212 in FIG. 2 and located off center in the diffused region 210. The third and final contact, that to the p side of junction 207, is made by plating gold to the substrate side of the crystal. Finally, a chemical etchant is used to produce a window region in contact 213 and a well 230 in substrate 201 in order to provide an area into which incoming radiation 250 can be coupled to the substrate 201 and thence to the quaternary layers.

Figure 3:
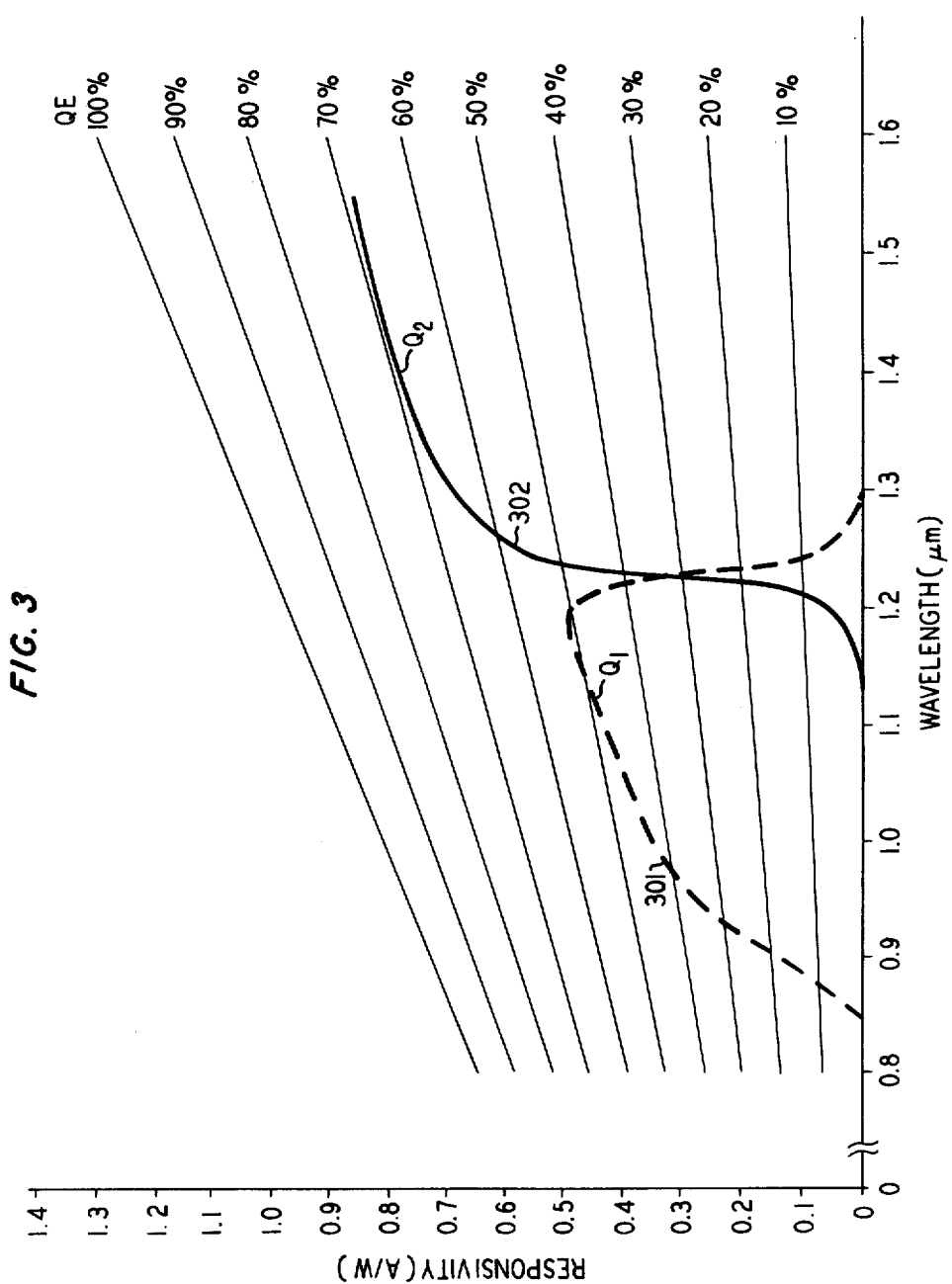
FIG. 3 is a graph of the spectral response of the photodetector constructed in accordance with the present invention.

The inversion of the original structure, together with reduced doping in the active layers, produced an improvement in almost all of the device characteristics. An example of the responsivity of the new diodes at zero bias is shown in FIG. 3 wherein the responsivity in $\mu A/\mu W$ versus wavelength in micrometers is shown for the diodes in each of the two quaternary layers. The peak responsivities are improved by a factor of 2 to 3 compared to those of the prior art configuration. In the particular diode constructed, the $Q_1$ layer detects photons in the range 0.9 to 1.25 $\mu m$ as indicated by curve 301 in FIG. 3. The top layer, $Q_2$, is the ternary In$_{0.53}$Ga$_{0.47}$As which provides the responsivity curve designated as 302 in FIG. 3. Use of this ternary permits extension of the long-wavelength response to about 1.6 $\mu m$. At zero bias the external quantum efficiency of $Q_1$ (determined by comparing the photoresponse with that of a calibrated Ge photodiode) is 50 percent at 1.15 $\mu m$, and that of $Q_2$ is 65 percent at 1.3 $\mu m$. This compares favorably with the 30 percent to 35 percent values obtained on previous devices. All of these values would be increased by about 30 percent by the addition of appropriate antireflection coatings.

The overlap of the spectral response shown in FIG. 3 represents optical crosstalk between the two channels. Proper utilization of the device would avoid use of this region, since to each side of it the crosstalk can be quite small. For example, on the short wavelength side of the crossover region, the crosstalk is $-19$ dB at 1.2 $\mu m$ but decreases to $-30$ dB at 1.15 $\mu m$; on the long wavelength side, it is $-43$ dB at 1.3 $\mu m$ and decreases further toward longer wavelengths.

Electrical characteristics of the inverted devices are tabulated in Table I. For comparison, the parameters of the best prior art (non-inverted) diodes have been included.

TABLE I

| Electrical Characteristics | | | | |
|---|---|---|---|---|
| | $E_g$ (eV) | $V_B$ (V) | $I_d$ (A) | C (pF) |
| Prior Art Structure | | | | |
| Diode $Q_1$ | 1.00 | 6 | $5 \times 10^{-8}$ | 40 |
| Diode $Q_2$ | 1.10 | 8 | $1 \times 10^{-8}$ | 12 |
| Present Structure | | | | |
| Diode $Q_1$ | 1.00 | 20 | $7 \times 10^{-8}$ | 4.5 |
| Diode $Q_2$ | 0.74 | 10 | $10 \times 10^{-8}$ | 3.3 |

Note, particularly, a significant improvement in breakdown voltage and capacitance, primarily due to the reduced doping of the ternary layers. The breakdown voltages $V_b$ of $Q_1$ and $Q_2$ have increased from 6 V to 20 V and from 8 V to 10 V, respectively. The capacitance, C, of $Q_1$ has decreased by almost an order of magnitude, from 40 pF to 4.5 pF, and $Q_2$ has shown a decrease in C from 12 pF to 3.3 pF. This large decrease in the device capacitance will permit these new devices to operate at much higher modulation bandwidths than their older counterparts.

What has been described hereinabove is merely an illustrative embodiment of the present invention. Numerous departures may be made by those skilled in the art without departing from the spirit and scope of the present invention. For example, either one or both of the quaternary layers may be changed in chemical composition in order to produce a device that operates over different wavelengths.

We claim:

1. A demultiplexing photodetector comprising an indium phosphide substrate (201), a first indium phosphide layer (202) of one conductivity type epitaxially grown on said substrate, a first quaternary layer (203) with a first bandgap having indium, gallium, arsenic and phosphorous as its elements and being epitaxially grown as the opposite conductivity type on said first indium phosphide layer, said first quaternary layer having a pn junction (207) within the layer, a second indium phosphide layer (204) of the opposite conductivity type epitaxially grown on said first quaternary layer, a second quaternary layer (205) with a second bandgap that is different than said first bandgap and being epitaxially grown on said second indium phosphide layer as a layer of opposite conductivity type, a region (210) of said second quaternary layer being of said first conductivity type thereby creating a pn junction (209) in said second quaternary layer, and electrode means (211, 212, and 213) for independently coupling potentials to the pn junctions in said first and second quaternary layers, CHARACTERIZED IN THAT the elements of said first and second quaternary layers are proportioned such that said first bandgap is higher in energy than said second bandgap, and said electrode means includes an electrode (213) deposited on the bottom surface of said substrate having an opening (230) such that input radiation can be coupled through said substrate to the quaternary layers.

2. A demultiplexing photodetector as defined in claim 1 wherein said electrode means is further CHARACTERIZED IN THAT at least two separate electrodes (211 and 212) are fabricated in direct contact with said second quaternary layer.

3. A demultiplexing photodetector as defined in claim 2 further CHARACTERIZED IN THAT said second quaternary layer is a ternary layer with a phosphorous content substantially equal to zero.

* * * * *